(12) United States Patent
Ushijima

(10) Patent No.: US 6,406,790 B1
(45) Date of Patent: Jun. 18, 2002

(54) COMPOSITE MATERIAL AND MANUFACTURING METHOD THEREFOR

(75) Inventor: Hitoshi Ushijima, Shizuoka (JP)

(73) Assignee: Yazaki Corporation, Tokyo (JP)

(*) Notice: Subject to any disclaimer, the term of this patent is extended or adjusted under 35 U.S.C. 154(b) by 0 days.

(21) Appl. No.: 09/666,832

(22) Filed: Sep. 21, 2000

(30) Foreign Application Priority Data

Sep. 30, 1999 (JP) ............................................ 11-279272

(51) Int. Cl.⁷ ................................................. B32B 9/00

(52) U.S. Cl. ..................... 428/408; 428/293.1; 428/389

(58) Field of Search .......................... 428/293.1, 293.4, 428/408, 389; 264/240, 245, 248

(56) References Cited

U.S. PATENT DOCUMENTS

| | | | |
|---|---|---|---|
| 4,572,270 A | * | 2/1986 | Funatani et al. |
| 5,111,870 A | | 5/1992 | Cook |
| 5,814,408 A | | 9/1998 | Ting et al. |

FOREIGN PATENT DOCUMENTS

| | | | |
|---|---|---|---|
| EP | 583062 | 2/1994 | |
| JP | 63-60244 | 3/1988 | ............. C22C/1/09 |
| JP | 2-212370 | 8/1990 | ............ C04B/35/80 |
| JP | 3-296776 | 12/1990 | ............ C04B/35/80 |
| JP | 3-174312 | 7/1991 | ............ C01B/31/00 |
| JP | 3-268853 | 11/1991 | ............ B22D/18/02 |

* cited by examiner

Primary Examiner—Merrick Dixon
(74) Attorney, Agent, or Firm—Sughrue Mion, PLLC

(57) ABSTRACT

A composite material incorporating vapor-phase-epitaxial carbon fibers and metal.

2 Claims, 5 Drawing Sheets

COMPOSITE MATERIAL AND MANUFACTURING METHOD THEREFOR

BACKGROUND OF INVENTION

1. Field of the Invention

The present invention relates to a technique about a composite material incorporating a matrix which is metal and fillers which are vapor-phase-epitaxial carbon fibers.

2. Related Art

Aluminum or an aluminum alloy which is excellent in heat conductivity is employed to manufacture a heat sink or the like to locally cool and radiate heat from a CPU or the like.

The size of notebook-type apparatuses and hand-held apparatuses each of which cannot be provided with a radiating fan has been reduced. Thus, a variety of apparatuses having considerably reduced weights have successively been developed. Moreover, increase in the number of clocks (the operation frequency) results in enlargement of the quantity of generated heat from the apparatus.

To meet the contradictory requirements, a material having a reduced weight and excellent heat conductivity has been required.

SUMMARY OF INVENTION

An object of the present invention is to improve the foregoing problem experienced with the conventional technique, that is, to provide a composite material having a considerably reduced weight and excellent heat conductivity.

To solve the foregoing problem, a composite material according to the present invention is a composite material comprising: vapor-phase-epitaxial carbon fibers in the form of feather-like fibers; and metal.

A method of manufacturing a composite material according to the present invention is a method of manufacturing a composite material comprising the steps of: dispersing vapor-phase-epitaxial carbon fibers in solvent and shifting the solution into a container; removing the solvent to form a fiber layer constituted by the vapor-phase-epitaxial carbon fibers; placing, in a pressure container, the fiber layer, a filter and metal; producing vacuum in the pressure container; and heating and melting the metal so that the fiber layer is impregnated with the molten metal through application of pressure.

BRIEF DESCRIPTION OF DRAWINGS

FIG. 4 is a diagram showing an example of a method of manufacturing a composite material according to the present invention, in which FIG. 4(a) is a diagram (a model diagram) showing a state where slurry obtained by dispersing the vapor-phase-epitaxial carbon fibers which are the feather-like fibers in solvent is shifted into a container, FIG. 4(b) is a diagram (a model diagram) showing a state where a fiber layer constituted by the vapor-phase-epitaxial carbon fibers which are the feather-like fibers has been formed in the container shown in FIG. 4(a), FIG. 4(c) is a model cross sectional view showing a state where the fiber layer is impregnated with molten metal and FIG. 4(d) is a diagram (a model diagram) showing the composite material (the composite material incorporating the vapor-phase-epitaxial carbon fibers which are the feather-like fibers and metal).

DETAILED DESCRIPTION OF PREFERRED EMBODIMENTS

The composite material according to the present invention is a vapor growth carbon fibers (hereinafter also called as "VGCF") exhibiting excellent heat conductivity. Therefore, the composite material exhibiting excellent heat conductivity can be obtained.

The vapor-phase-epitaxial carbon fibers for use in the composite material according to the present invention include known needle crystal called a "whisker". The foregoing needle crystal has a one-dimensional shape. When the needle crystal is employed to mold a composite material for use to meet a three-dimensional purpose, for example, heat radiation, the direction of orientation of the needle crystal must be controlled. The control is, however, very difficult.

Polyacrylonitrile carbon fibers and pitch carbon fibers, which are long carbon fibers, are known as one-dimensional carbon fibers. When the foregoing long carbon fibers are chopped or milled (when the long carbon fibers are milled by a usual method, complete powder cannot be obtained and, therefore, the fiber shape is maintained), a similar problem in terms of the shape arises. The heat conductivity of the long carbon fibers is considerably lower than that of the vapor-phase-epitaxial carbon fibers (the heat conductivity of the vapor-phase-epitaxial carbon fibers is about 1500 w/mK, while that of the PAN or pitch carbon fibers is about 1 w/mK to about 600 w/mK). Therefore, if a composite material with aluminum (having a heat conductivity of 200 w/mK to 270 w/mK) is prepared, the heat conductivity cannot satisfactorily be raised.

Figure 5:
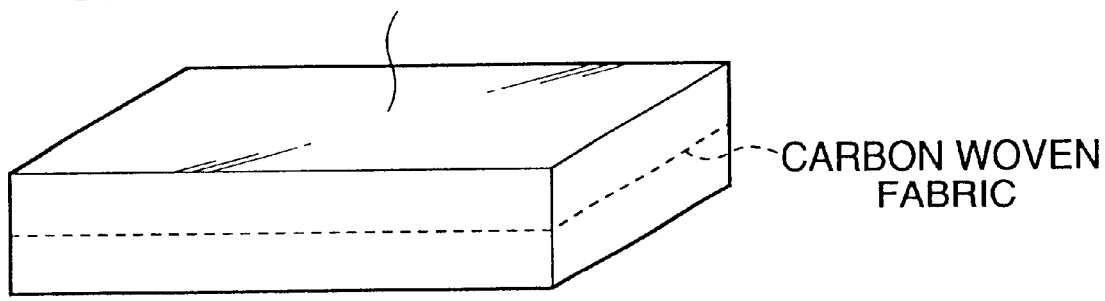
FIG. 5 is a diagram (a model diagram) showing the composite material incorporating woven fabric constituted by long carbon fibers as fillers.

The conventional composite material (see FIG. 5) including woven fabric constituted by long carbon fibers has a structure that the fibers are oriented two-dimensionally. Also the heat conductivity of the foregoing composite material has directional properties. Therefore, satisfactory one-dimensional or two-dimensional heat conductivity can be obtained. However, satisfactory three-dimensional heat conductivity cannot be obtained. Although so-called 3D woven fabric (stereoscopically woven fabric) may be employed, a high filling density with which a satisfactory effect can be obtained cannot be realized. What is worse, the foregoing woven fabric is a costly fabric from a viewpoint of practical use.

Figure 1:
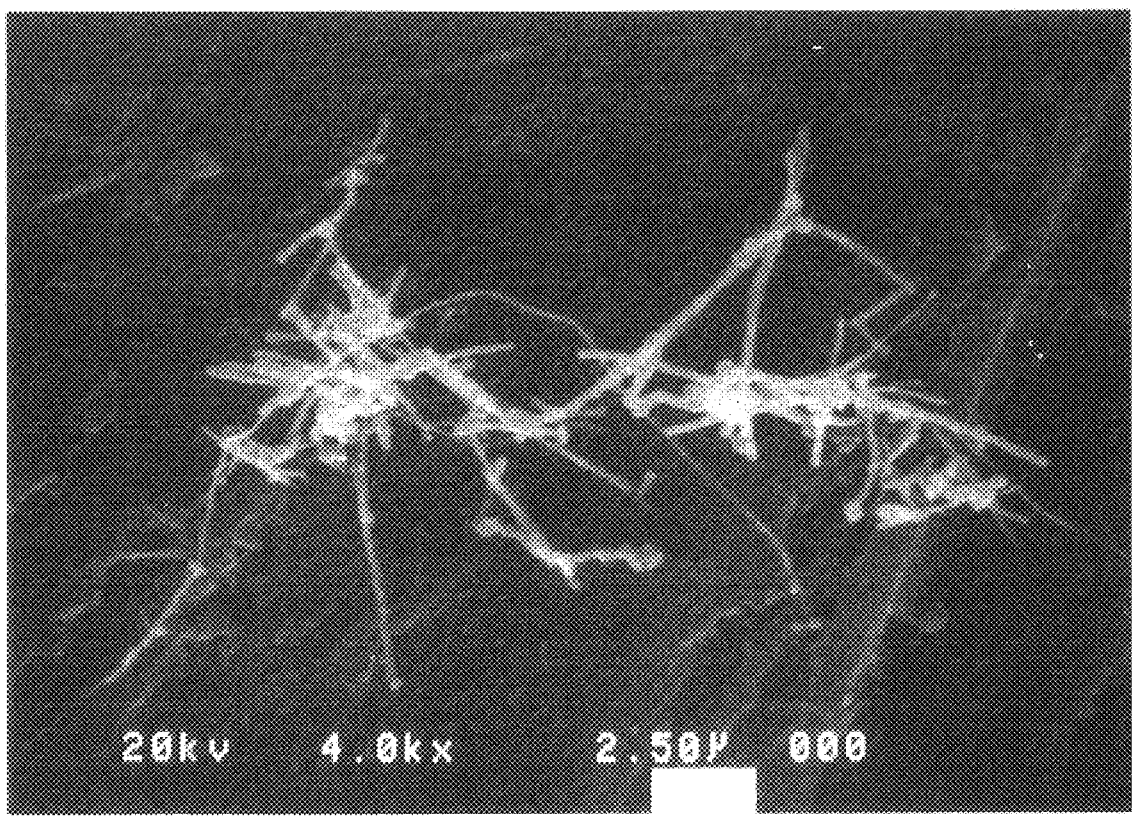
FIG. 1 is a photograph of vapor-phase-epitaxial carbon fibers which are feather-like fibers taken by a scanning electron microscope.
Figure 2:
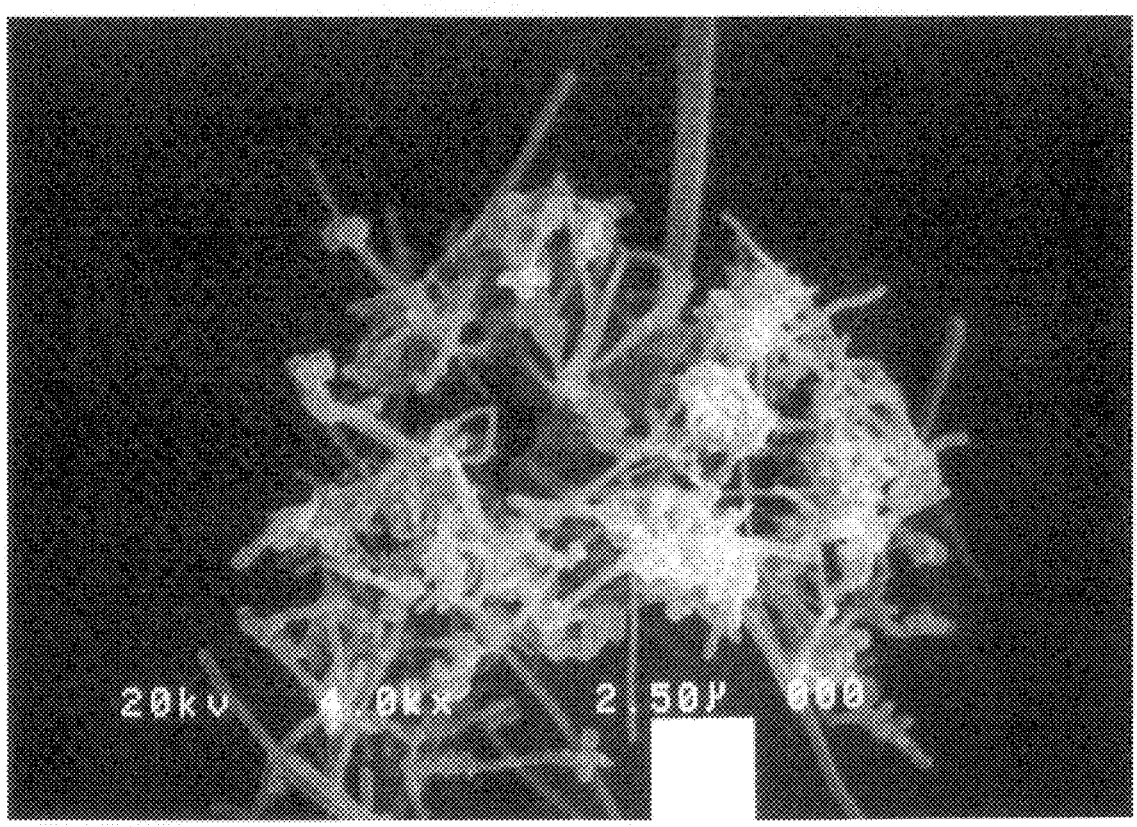
FIG. 2 is another photograph of the vapor-phase-epitaxial carbon fibers which are feather-like fibers taken by a scanning electron microscope.
Figure 3:
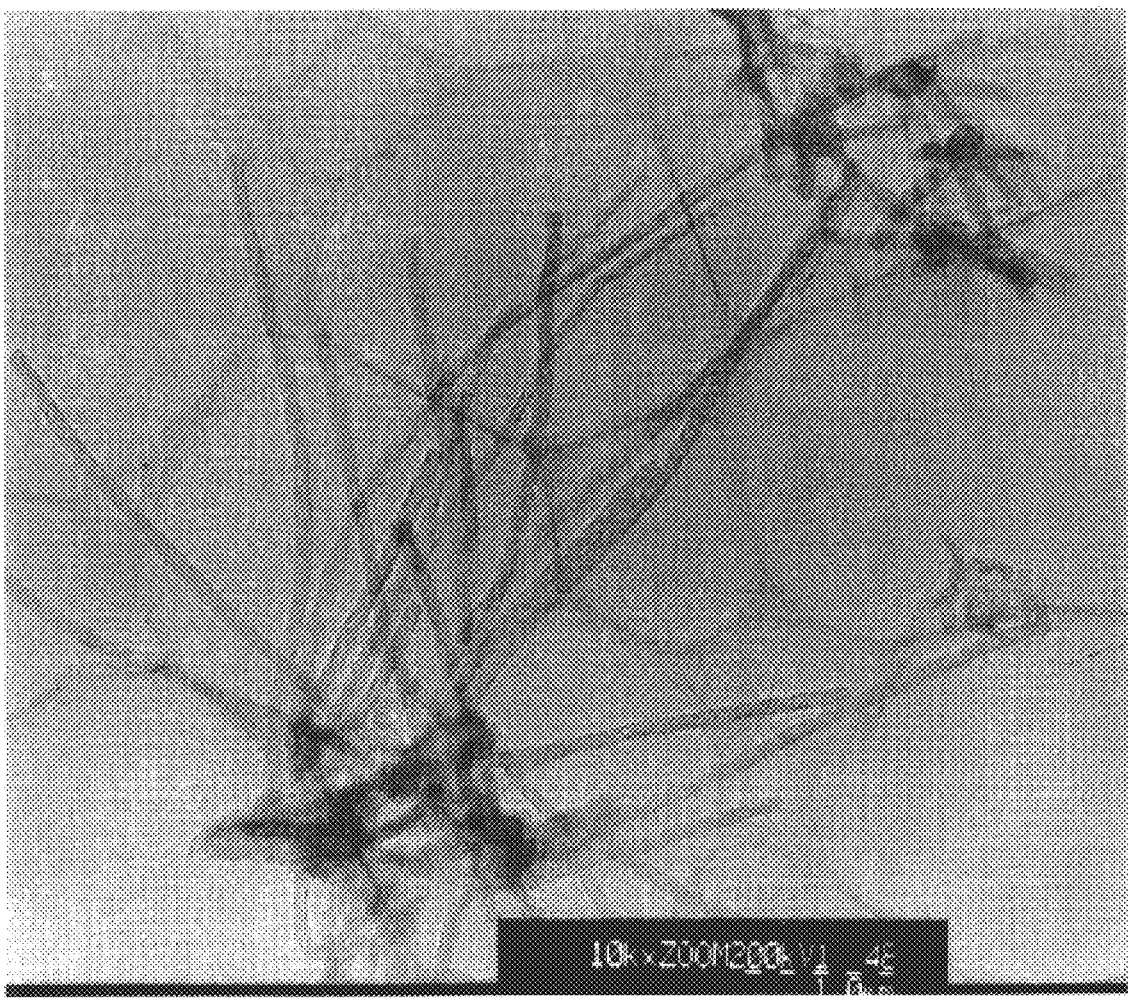
FIG. 3 is a photograph of a preferred vapor-phase-epitaxial carbon fibers which are feather-like fibers taken by a transmission electron microscope.

Therefore, the vapor-phase-epitaxial carbon fibers for use in the composite material according to the present invention must be vapor-phase-epitaxial carbon fibers which are the feather-like fibers. The vapor-phase-epitaxial carbon fibers which are the feather-like fibers have a specific gravity of about 2.0 (the specific gravity of aluminum is 2.7). Moreover, the vapor-phase-epitaxial carbon fibers of the foregoing type have branches (ramification) and partially include bending and, in some cases, restrictions. In addition, the fibbers are twined themselves or mutually so that a fiber block having an undefined shape and an overall size of 0.03 mm to 1 mm is formed. The vapor-phase-epitaxial carbon fibers which are the feather-like fibers have branches. Therefore, heat can be conducted through a three-dimensional network. Hence it follows that a composite material excellent in three-dimensional heat conductivity can be obtained when the foregoing vapor-phase-epitaxial carbon fibers are employed as fillers. FIGS. 1 and 2 show photographs of the vapor-phase-epitaxial carbon fibers which are feather-like fibers having bending, sometimes restrictions and twined themselves or mutually taken by a scanning electron microscope. FIG. 3 shows the same taken by a transmission electron microscope.

The vapor-phase-epitaxial carbon fibers which are the feather-like fibers are obtained by performing a vapor phase epitaxial process performed such that hydrocarbon, such as benzene, serves as a carbon source and iron is used as a core under the presence of hydrogen. At this time, conditions, such as the temperature, the atmospheric pressure and the quantity of supply of hydrocarbon which is the raw material, are changed. Thus, the vapor-phase-epitaxial carbon fibers can be obtained which are the feather-like fibers having branches (ramification) and partially including bending and, in some cases, restrictions and twined themselves or mutually. The plural feather-like fibers are mutually twined so that a fiber block is formed. Hitherto, the vapor-phase-epitaxial carbon fibers have been manufactured under conditions which do not form branches and bending for the purpose of using the vapor-phase-epitaxial carbon fibers in a usual purpose, for example, obtaining satisfactory mechanical strength.

It is preferable that metal serving as the matrix in the composite material according to the present invention has high heat conductivity and a low specific gravity from a viewpoint of the spirit of the present invention. That is, it is preferable that any one of aluminum, a variety of aluminum alloys and magnesium alloys is employed.

The composite material according to the present invention can be obtained, for example, as follows.

The vapor-phase-epitaxial carbon fibers which are the feather-like fibers are delicate and brittle fibers which can easily be broken owing to exertion of stress. Thus, the three-dimensional network can easily be lost. Therefore, the vapor-phase-epitaxial carbon fibers are dispersed in organic solvent (as an alternative to this, mixed solvent may be employed), such as water, alcohol or ketone (the foregoing solvent is collectively called "solvent"). If necessary, a chemical, such as a surface active agent, for improving the dispersing characteristic is added to form the solution into slurry 101. Then, the slurry 101 is injected into a container made of a porous material 102 (filter paper or porous ceramic) and having a bottom which permits penetration of liquid (see FIG. 4(*a*)). Then, the solvent is removed so that the fiber layer 103 constituted by the vapor-phase-epitaxial carbon fibers which are the feather-like fibers as shown in FIG. 4(*b*) is formed.

Figure 4:
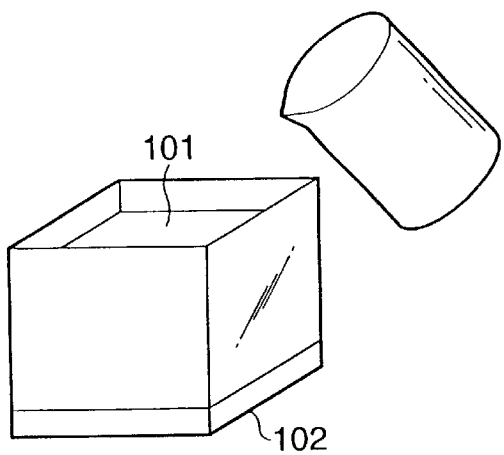
Figure 4:
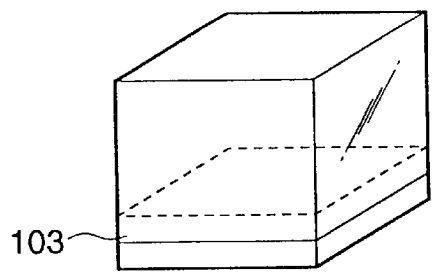
Figure 4:
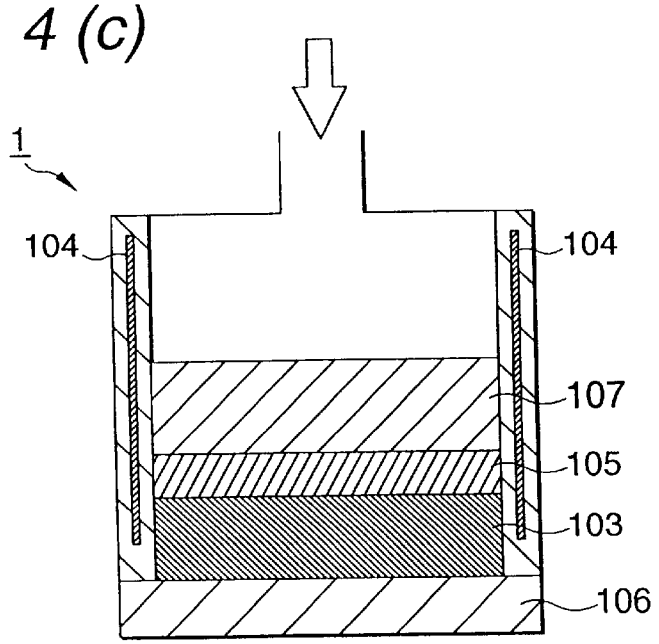
Figure 4:
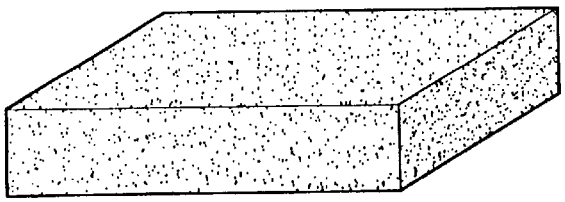

The obtained fiber layer is shifted into a container 1 (a pressure container) provided with a heater 104 as shown in FIG. 4(*c*). The bottom (a "base material" in the drawing) portion 106 can be removed as described later.

A filter 105 constituted by a porous material (which is porous ceramics in this embodiment) having heat resistance is laminated on the foregoing fiber layer 103. Then, metal (in the solid form) is laminated on the filter 105.

After the fiber layer 103, the filter 105 and the metal 107 have been placed in the pressure container, vacuum is produced in the pressure container. Moreover, the heater 104 provided for the container is operated to heat and melt the metal 107. Moreover, pressure is applied to the inside portion of the container 1 by using a gas which is inactive with respect to the molten metal which is the matrix and carbon or argon gas (the argon gas is used in this embodiment). Thus, the fiber layer 103 is, through the application of pressure, impregnated with molten metal serving as the matrix component. Then, the operation of the heater 104 of the container 1 is interrupted to cool the system and solidify the metal. After the temperature has been decreased, the base material 106 in the bottom of the container is removed. Thus, the composite material incorporating the vapor-phase-epitaxial carbon fibers, which are the feather-like fibers is extracted.

As described above, impregnation of molten metal is performed under pressure of the inactive gas. Thus, an excellent composite material can be obtained even if the molten metal which can easily be oxidized is used.

The filter is able to vertically move in the pressure container to maintain an optimum space below the filter. Therefore, excessive enlargement of the quantity of the matrix component in the obtained composite material can be prevented. Moreover, breakage of the vapor-phase-epitaxial carbon fibers which are the feather-like fibers can substantially completely be prevented. Hence it follows that the heat conductivity and an effect of reducing the weight of the vapor-phase-epitaxial carbon fillers which are the feather-like fibers can satisfactorily be improved.

When the shape of each of the base material and the porous ceramics is changed, a variety of shapes may be realized, for example, a shape suitable for a heat sink. Therefore, a post-process for realizing the shape can be omitted or the foregoing post-process can be facilitated.

The foregoing method of manufacturing the composite material enables FRM (fiber-reinforced metal) which cannot easily be manufactured and in which the specific gravity of the matrix is higher than that of the filler to easily be obtained. The obtained composite material exhibits excellent dispersion of the filler, the material being capable of preventing dispersion of various performance (the heat conducting characteristic, the conductivity, the strength and the elasticity) and reducing the orientation. Note that also the method of manufacturing the composite material according to the present invention may be applied when a composite material incorporating a filler which is constituted by a usual vapor-phase-epitaxial carbon fibers as well as the vapor-phase-epitaxial carbon fibers which are the feather-like fibers.

The composite material according to the present invention is light in weight and exhibits excellent heat conductivity because of no directional properties. Since the carbon fibers which are feather-like fibers are used as the fillers, the composite material also exhibits excellent mechanical strength.

The method of manufacturing the composite material enables the composite material (the fiber-reinforced metal) to be obtained which exhibits excellent dispersion of the fillers, which is capable of preventing scattering of the performance and with which directional properties can be reduced.

What is claimed is:

1. A composite material comprising:

vapor-phase-epitaxial carbon fibers in the form of feather-like fibers; and a metal impregnated in said fibers.

2. A method of manufacturing a composite material comprising the steps of:

dispersing vapor-phase-epitaxial carbon fibers in solvent;

removing said solvent to form a fiber layer defined by said vapor-phase-epitaxial carbon fibers;

placing, in a pressure container, said fiber layer, a filter and metal;

producing vacuum in said pressure container; and heating and melting said metal so that said fiber layer is impregnated with the molten metal through application of pressure.

* * * * *